(12) United States Patent
Molnar et al.

(10) Patent No.: US 9,055,688 B2
(45) Date of Patent: *Jun. 9, 2015

(54) INPUT/OUTPUT CIRCUITS HAVING STATUS INDICATORS ALIGNED WITH RESPECTIVE TERMINALS

(75) Inventors: Nathan J. Molnar, Shaker Heights, OH (US); David S. Wehrle, Chesterland, OH (US); Douglas R. Bodmann, Shaker Heights, OH (US); Robert J. Kretschmann, Bay Village, OH (US); Joseph G. Vazach, Mentor, OH (US); Gregg M. Sichner, Mentor, OH (US); Terence S. Tenorio, Solon, OH (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 262 days.

This patent is subject to a terminal disclaimer.

(21) Appl. No.: 13/214,072

(22) Filed: Aug. 19, 2011

(65) Prior Publication Data
US 2012/0044083 A1 Feb. 23, 2012

Related U.S. Application Data

(60) Provisional application No. 61/375,587, filed on Aug. 20, 2010, provisional application No. 61/379,894, filed on Sep. 3, 2010.

(51) Int. Cl.
*G08B 21/00* (2006.01)
*H05K 7/14* (2006.01)
(52) U.S. Cl.
CPC ............ *H05K 7/1481* (2013.01); *H05K 7/1469* (2013.01)
(58) Field of Classification Search
CPC ........................... H05K 7/1469; H05K 7/1481

USPC ........ 340/686.1, 687; 439/76.1, 82, 153, 159, 439/532, 660, 700, 715, 716, 729; 361/729, 361/759; 235/375; 307/139; 29/825; 710/8, 710/20; 337/241
See application file for complete search history.

(56) References Cited

U.S. PATENT DOCUMENTS

| 4,038,641 | A | 7/1977 | Bouknecht et al. |
| 4,038,642 | A | 7/1977 | Bouknecht et al. |

(Continued)

FOREIGN PATENT DOCUMENTS

JP 0787218 3/1995

OTHER PUBLICATIONS

U.S. Appl. No. 13/213,996, filed Aug. 19, 2011, Molnar.

(Continued)

*Primary Examiner* — Steven Lim
*Assistant Examiner* — Sisay Yacob
(74) *Attorney, Agent, or Firm* — Fletcher Yoder P.C.

(57) ABSTRACT

Systems and methods are provided for aligning status indicators on a terminal block of an I/O device by locating the status indicators directly adjacent to or integrated directly within their respective terminals on the terminal block. The status indicators are illuminated by LEDs or other light emitters disposed within a housing of the I/O device. Light from the LEDs are directed to the status indicators by light pipes disposed within the housing of the I/O device. LED activation circuitry disposed within the housing determines a manner in which to activate the LEDs to illuminate the status indicators based on inputs and outputs between the I/O device and a controlled process. In certain embodiments, the status indicators are disposed on a raised section of the I/O device, which may be part of a removable LED indication assembly including the LEDs, light pipes, and LED activation circuitry.

21 Claims, 9 Drawing Sheets

(56) References Cited

U.S. PATENT DOCUMENTS

| | | | |
|---|---|---|---|
| 4,053,950 A | 10/1977 | Bourke et al. | |
| 4,144,565 A | 3/1979 | Bouknecht et al. | |
| 4,217,624 A | 8/1980 | Tuck | |
| 4,833,589 A | 5/1989 | Oshiga et al. | |
| 4,868,669 A | 9/1989 | Miyazawa | |
| 5,483,229 A | 1/1996 | Tamura et al. | |
| 5,611,057 A | 3/1997 | Pecone et al. | |
| 5,678,084 A | 10/1997 | Hori | |
| 5,716,241 A * | 2/1998 | Hennemann et al. | 439/716 |
| 5,790,374 A | 8/1998 | Wong | |
| 5,912,710 A | 6/1999 | Fujimoto | |
| 5,968,146 A | 10/1999 | Tanaka et al. | |
| 6,027,379 A * | 2/2000 | Hohorst | 439/715 |
| 6,172,875 B1 * | 1/2001 | Suzuki et al. | 361/729 |
| 6,283,786 B1 | 9/2001 | Margulis et al. | |
| 6,425,770 B1 * | 7/2002 | Lostoski et al. | 439/76.1 |
| 6,446,202 B1 | 9/2002 | Krivoshein et al. | |
| 6,449,715 B1 | 9/2002 | Krivoshein | |
| 6,502,956 B1 | 1/2003 | Wu | |
| 6,621,692 B1 | 9/2003 | Johnson et al. | |
| 6,692,132 B1 | 2/2004 | Meeker | |
| 6,736,678 B2 | 5/2004 | Yao | |
| 6,738,261 B2 | 5/2004 | Vier et al. | |
| 6,763,398 B2 | 7/2004 | Brant et al. | |
| 6,775,791 B2 | 8/2004 | McAfee | |
| 6,802,737 B2 * | 10/2004 | Bergner et al. | 439/532 |
| 6,815,625 B1 | 11/2004 | Leopold et al. | |
| 6,862,174 B2 | 3/2005 | Chien et al. | |
| 6,980,122 B2 | 12/2005 | Novikov | |
| 7,297,019 B2 | 11/2007 | Landis et al. | |
| 7,429,188 B2 | 9/2008 | Wu | |
| 7,553,044 B2 | 6/2009 | Wedell | |
| 7,555,642 B2 | 6/2009 | Gagneraud et al. | |
| 7,581,053 B2 | 8/2009 | Sichner et al. | |
| 7,676,640 B2 | 3/2010 | Chow et al. | |
| 7,702,831 B2 | 4/2010 | Ma et al. | |
| 7,952,887 B2 | 5/2011 | Kosugi et al. | |
| 8,073,985 B1 | 12/2011 | Ni et al. | |
| 8,092,060 B2 | 1/2012 | Osada | |
| 8,174,835 B2 | 5/2012 | Kim et al. | |
| 8,199,511 B2 | 6/2012 | Kim et al. | |
| 8,274,230 B2 | 9/2012 | Chiu | |
| 8,410,364 B2 | 4/2013 | Dunwoody et al. | |
| 8,411,440 B2 | 4/2013 | Dunwoody et al. | |
| 8,441,792 B2 | 5/2013 | Dunwoody et al. | |
| 8,493,718 B2 | 7/2013 | Zhang | |
| 8,503,183 B2 | 8/2013 | Hamilton et al. | |
| 8,514,585 B2 | 8/2013 | Zhang | |
| 8,520,401 B2 | 8/2013 | Tian et al. | |
| 2001/0047442 A1 | 11/2001 | Oomori | |
| 2002/0072256 A1 * | 6/2002 | Lostoski et al. | 439/76.1 |
| 2002/0081890 A1 | 6/2002 | Obermaier | |
| 2003/0051098 A1 | 3/2003 | Brant et al. | |
| 2004/0206616 A1 | 10/2004 | Leopold et al. | |
| 2004/0207342 A1 | 10/2004 | Novikov | |
| 2004/0207343 A1 | 10/2004 | Novikov | |
| 2005/0040424 A1 | 2/2005 | Erchak et al. | |
| 2005/0051785 A1 | 3/2005 | Erchak et al. | |
| 2005/0059178 A1 | 3/2005 | Erchak et al. | |
| 2005/0059179 A1 | 3/2005 | Erchak et al. | |
| 2005/0063647 A1 | 3/2005 | Thornton et al. | |
| 2005/0127375 A1 | 6/2005 | Erchak et al. | |
| 2005/0219033 A1 * | 10/2005 | Bortolloni et al. | 337/241 |
| 2005/0260884 A1 | 11/2005 | Yueh | |
| 2006/0043391 A1 | 3/2006 | Erchak et al. | |
| 2006/0250210 A1 | 11/2006 | Dowil et al. | |
| 2006/0250223 A1 | 11/2006 | Koga et al. | |
| 2007/0081315 A1 | 4/2007 | Mondor et al. | |
| 2007/0112982 A1 | 5/2007 | Sichner et al. | |
| 2007/0214487 A1 | 9/2007 | Joung | |
| 2007/0230110 A1 | 10/2007 | Starr et al. | |
| 2007/0255938 A1 | 11/2007 | Gagneraud et al. | |
| 2007/0274070 A1 | 11/2007 | Wedell | |
| 2008/0003867 A1 | 1/2008 | Wu | |
| 2008/0005471 A1 | 1/2008 | Ma et al. | |
| 2008/0052452 A1 | 2/2008 | Chow et al. | |
| 2008/0071931 A1 | 3/2008 | Chow et al. | |
| 2008/0071973 A1 | 3/2008 | Chow et al. | |
| 2008/0071974 A1 | 3/2008 | Chow et al. | |
| 2008/0071975 A1 | 3/2008 | Chow et al. | |
| 2008/0071976 A1 | 3/2008 | Chow et al. | |
| 2008/0071977 A1 | 3/2008 | Chow et al. | |
| 2008/0071978 A1 | 3/2008 | Chow et al. | |
| 2008/0082736 A1 | 4/2008 | Chow et al. | |
| 2008/0086631 A1 | 4/2008 | Chow et al. | |
| 2008/0147964 A1 | 6/2008 | Chow et al. | |
| 2008/0177922 A1 | 7/2008 | Chow et al. | |
| 2008/0313388 A1 | 12/2008 | Chow et al. | |
| 2008/0313389 A1 | 12/2008 | Chow et al. | |
| 2009/0204731 A1 * | 8/2009 | Mulligan et al. | 710/20 |
| 2010/0007590 A1 | 1/2010 | Chae et al. | |
| 2010/0082892 A1 | 4/2010 | Ma et al. | |
| 2010/0082893 A1 | 4/2010 | Ma et al. | |
| 2010/0110645 A1 | 5/2010 | Campini et al. | |
| 2010/0149997 A1 | 6/2010 | Law et al. | |
| 2010/0201278 A1 | 8/2010 | Zhao | |
| 2010/0254096 A1 * | 10/2010 | Kim et al. | 361/737 |
| 2010/0254100 A1 | 10/2010 | Kim et al. | |
| 2011/0032108 A1 | 2/2011 | Lavene et al. | |
| 2011/0226506 A1 | 9/2011 | Hamilton et al. | |
| 2011/0234109 A1 | 9/2011 | Chiu | |
| 2012/0042120 A1 | 2/2012 | Ni et al. | |
| 2012/0146535 A1 | 6/2012 | Lee et al. | |

OTHER PUBLICATIONS

U.S. Appl. No. 13/213,921, filed Aug. 19, 2011, Vazach.
U.S. Appl. No. 13/213,991, filed Aug. 19, 2011, Molnar.
U.S. Appl. No. 13/213,950, filed Aug. 19, 2011, Wehrle.
U.S. Appl. No. 13/214,027, filed Aug. 19, 2011, Bodmann.
U.S. Appl. No. 13/214,035, filed Aug. 19, 2011, Kretschmann.

* cited by examiner

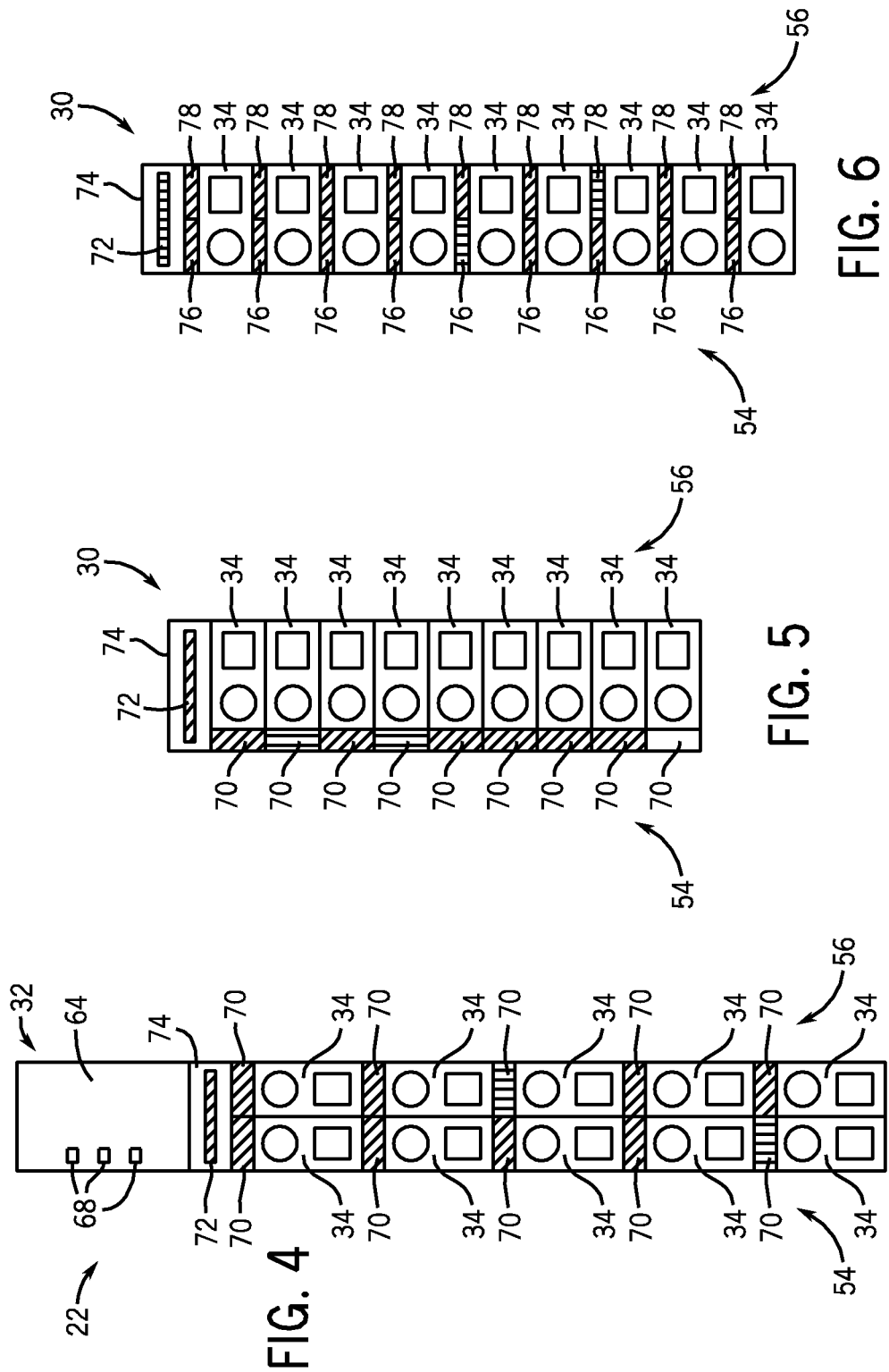

INPUT/OUTPUT CIRCUITS HAVING STATUS INDICATORS ALIGNED WITH RESPECTIVE TERMINALS

CROSS REFERENCE TO RELATED APPLICATIONS

This application claims priority of U.S. Provisional Patent Application No. 61/375,587, filed Aug. 20, 2010, which is herein incorporated in its entirety by reference, and of U.S. Provisional Patent Application No. 61/379,894, filed Sep. 3, 2010, which is herein incorporated in its entirety by reference.

BACKGROUND

The invention relates generally to the field of automation control systems, such as those used in industrial and commercial settings. More particularly, embodiments of the present invention relate to techniques for providing, accessing, configuring, operating, or interfacing with input/output (I/O) devices that are configured for coupling and interaction with an automation controller.

Automation controllers are special purpose computers used for controlling industrial automation and the like. Under the direction of stored programs, a processor of the automation controller examines a series of inputs (e.g., electrical input signals to the automation controller) reflecting the status of a controlled process and changes outputs (e.g., electrical output signals from the automation controller) based on analysis and logic for affecting control of the controlled process. The stored control programs may be continuously executed in a series of execution cycles, executed periodically, or executed based on events. The inputs received by the automation controller from the controlled process and the outputs transmitted by the automation controller to the controlled process are normally passed through one or more I/O devices, which are components of an automation control system that serve as an electrical interface between the automation controller and the controlled process.

Traditional I/O devices typically include a base configured to couple the I/O device with a bus bar or the like, a terminal block for communicatively coupling the I/O device with field devices, and an I/O module that includes circuitry for performing communication functions and/or logic operations. In operation, a traditional I/O device typically communicatively couples with field devices (e.g., sensors and actuators) via terminals of the terminal block such that the I/O device can receive input signals from the field devices and provide output signals to the field devices. In traditional automation control systems, status indicators relating to such input and output signals are typically located on a status display of the I/O module of the I/O device. This allows users to observe the status of aspects of the automation control system by viewing the indicators on the I/O module and correlating the indicators to related devices (e.g., sensors and actuators) based on where the devices attach to the terminal block. Specifically, for example, a correspondence between indicators and terminals may be identified based on address labels. However, these address labels can become obscured by wiring. It is now recognized that it is desirable to provide more efficient and effective techniques for providing status indications on an I/O device.

BRIEF DESCRIPTION

The present invention addresses shortcomings of traditional I/O devices by aligning status indicators on a terminal block of an I/O device with respective terminals on the terminal block. In certain embodiments, the status indicators are disposed directly adjacent to the respective terminals. For example, status indicators may be positioned above, below, to the left, and/or to the right of the terminals such that there is a direct physical correspondence between the terminals and corresponding indicators. In other embodiments, the status indicators include transparent or translucent portions on a face of the terminal block surrounding terminal points, such that the status indicators are integrated directly within the associated terminals. In certain embodiments, each terminal is associated with more than one status indicator, with each status indicator being disposed adjacent to or integrated directly within the respective terminal.

The status indicators are illuminated by light emitters, such as light emitting diodes (LEDs), that are disposed within a housing of the I/O device. It should be noted that while LEDs are utilized as an example throughout the following discussion, LEDs are merely representative of one embodiment of light emitters that may be utilized in accordance with present techniques. Light pipes, which are also disposed within the housing of the I/O device, function to direct light from the LEDs to the status indicators. In certain embodiments, each of the light pipes is configured to receive light from two or more LEDs and to direct the light to two or more of the status indicators. LED activation circuitry disposed within the housing determines a manner in which to activate the LEDs to illuminate the appropriate status indicators based on inputs and outputs received and transmitted between the I/O device and a controlled process.

In certain embodiments, the status indicators are disposed on a raised section of the terminal block from a front face of the terminal block. Indeed, the raised section may be part of a removable LED indication assembly, which may include the LEDs, light pipes, LED activation circuitry, and other active decision-making elements, and may be removed and inserted into the housing of the terminal block as needed. Furthermore, in certain embodiments, both the raised section and the front face may be sloped to facilitate management of wires connected to the terminal points.

DRAWINGS

These and other features, aspects, and advantages of the present invention will become better understood when the following detailed description is read with reference to the accompanying drawings in which like characters represent like parts throughout the drawings, wherein:

FIG. 4 is a front view of an exemplary embodiment of an exemplary I/O device with a terminal block having a terminal status LED indicator disposed adjacent to each terminal of the terminal block in accordance with embodiments of the present techniques;

FIG. 5 is a front view of an exemplary embodiment of a terminal block having a terminal status LED indicator disposed adjacent to each terminal of the terminal block in accordance with embodiments of the present techniques;

FIG. 6 is a front view of an exemplary embodiment of a terminal block having a terminal I/O bit status LED indicator and a terminal field device status LED indicator disposed adjacent to each terminal of the terminal block in accordance with embodiments of the present techniques;

DETAILED DESCRIPTION

Figure 1:
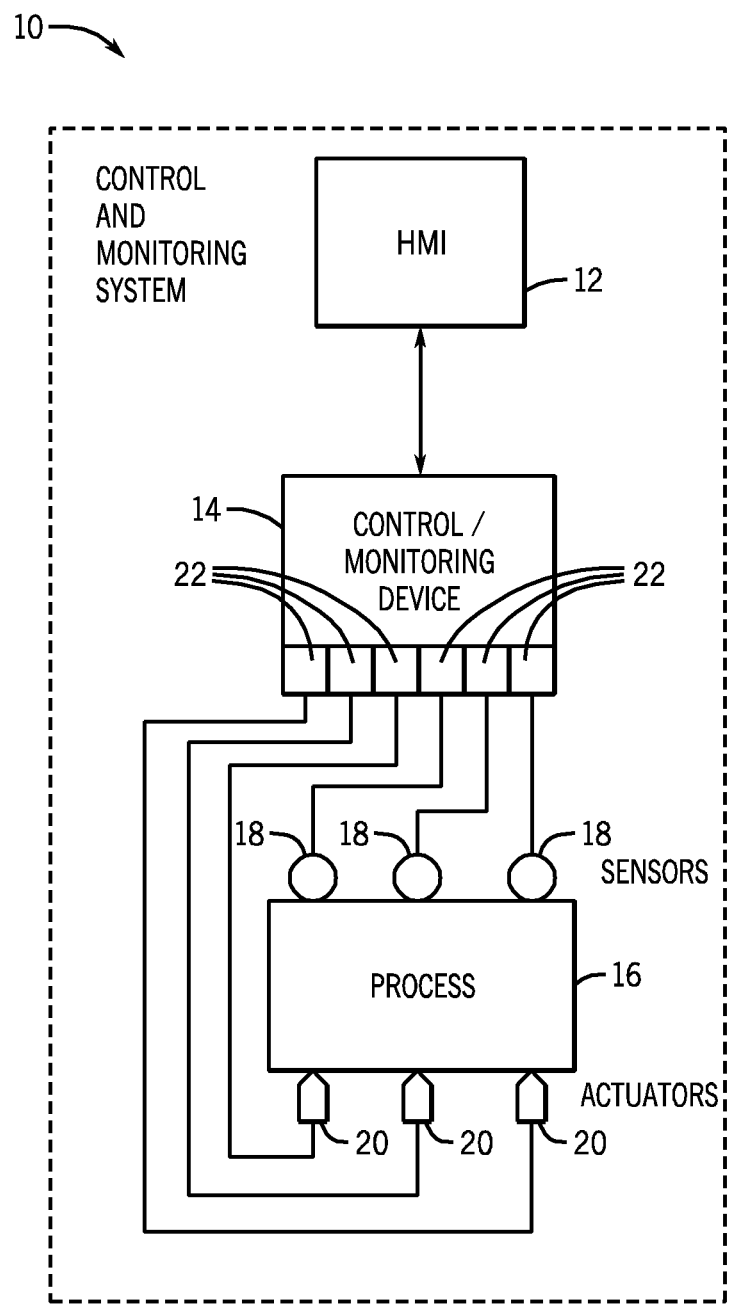
FIG. 1 is a diagrammatical representation of an exemplary control and monitoring system adapted to interface with networked components and configuration equipment in accordance with embodiments of the present techniques.

FIG. 1 is a diagrammatical representation of an exemplary control and monitoring system adapted to interface with networked components and configuration equipment in accordance with embodiments of the present techniques. The control and monitoring system is generally indicated by reference numeral 10. Specifically, the control and monitoring system 10 is illustrated as including a human machine interface (HMI) 12 and an automation controller or control/monitoring device 14 adapted to interface with components of a process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components, such as electric motors, valves, actuators, temperature elements, pressure sensors, or a myriad of manufacturing, processing, material handling, and other applications. Further, the process 16 may comprise control and monitoring equipment for regulating process variables through automation and/or observation.

For example, the illustrated process 16 comprises sensors 18 and actuators 20. The sensors 18 may comprise any number of devices adapted to provide information regarding process conditions. The actuators 20 may include any number of devices adapted to perform a mechanical action in response to a signal from a controller (e.g., an automation controller). The sensors 18 and actuators 20 may be utilized to operate process equipment. Indeed, they may be utilized within process loops that are monitored and controlled by the control/monitoring device 14 and/or the HMI 12. Such a process loop may be activated based on process inputs (e.g., input from a sensor 18) or direct operator input received through the HMI 12.

As illustrated, the sensors 18 and actuators 20 are in communication with the control/monitoring device 14 and may be assigned a particular address in the control/monitoring device 14 that is accessible by the HMI 12. As illustrated, the sensors 18 and actuators 20 may communicate with the control/monitoring device 14 via one or more I/O devices 22 coupled to the control/monitoring device 14. The I/O devices 22 may transfer input and output signals between the control/monitoring device 14 and the controlled process 16. The I/O devices 22 may be integrated with the control/monitoring device 14, or may be added or removed via expansion slots, bays or other suitable mechanisms. For example, as described in greater detail below, additional I/O devices 22 may be added to add functionality to the control/monitoring device 14. Indeed, if new sensors 18 or actuators 20 are added to control the process 16, additional I/O devices 22 may be added to accommodate and incorporate the new features functionally with the control/monitoring device 14. The I/O devices 22 serve as an electrical interface to the control/monitoring device 14 and may be located proximate or remote from the control/monitoring device 14, including remote network interfaces to associated systems.

The I/O devices 22 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O devices 22 may convert between AC and DC analog signals used by devices on a controlled machine or process and DC logic signals used by the control/monitoring device 14. Additionally, some of the I/O devices 22 may provide digital signals to digital I/O devices and receive digital signals from digital I/O devices. Further, in some embodiments, the I/O devices 22 that are used to control machine devices or process control devices may include local microcomputing capability on an I/O module of the I/O devices 22.

In some embodiments, the I/O devices 22 may be located in close proximity to a portion of the control equipment, and away from the remainder of the control/monitoring device 14. In such embodiments, data may be communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

Figure 2:
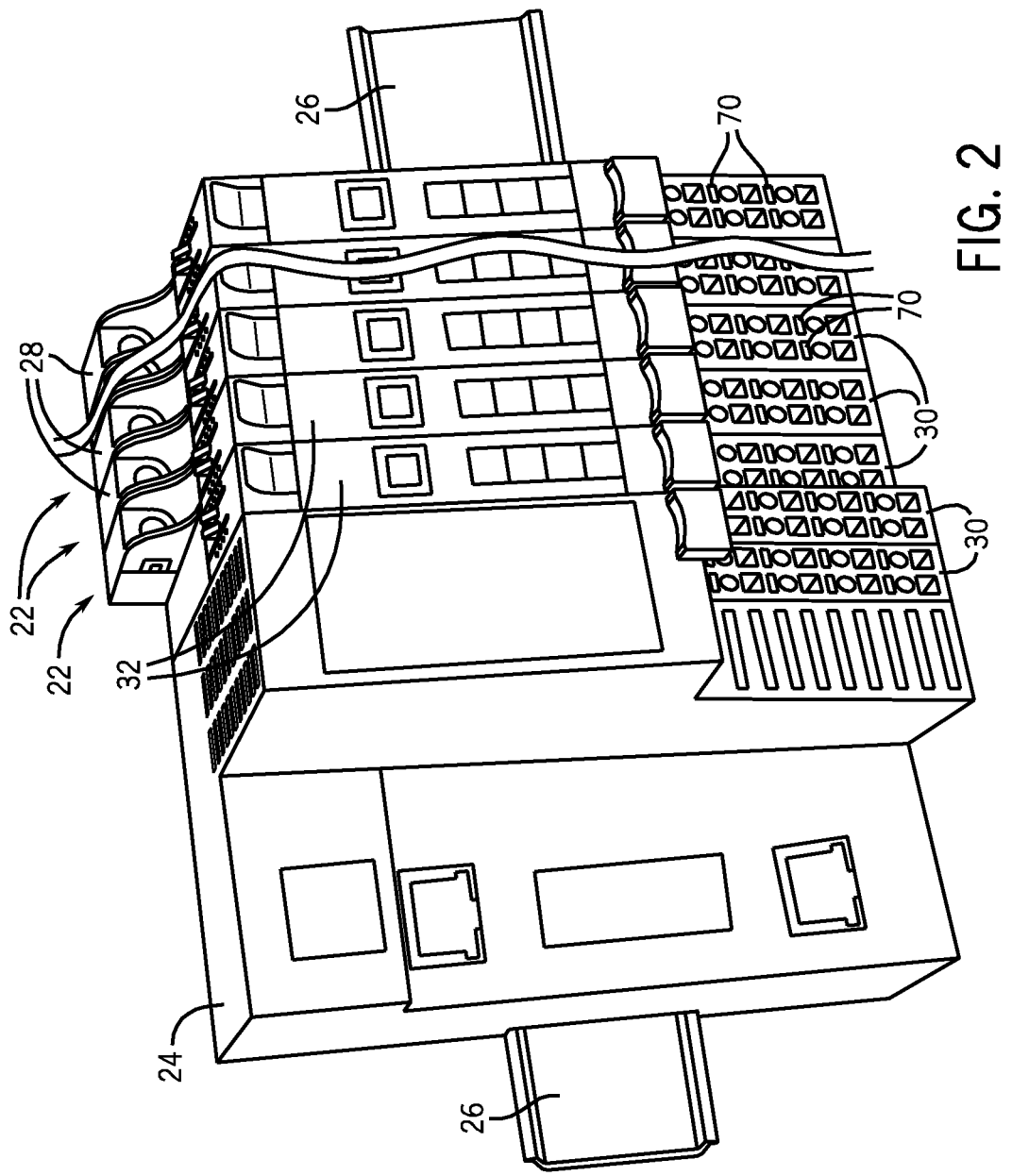
FIG. 2 is a perspective view of a plurality of I/O devices connected to an I/O adapter in accordance with embodiments of the present techniques.

FIG. 2 is a perspective view of a plurality of I/O devices 22 connected to an I/O adapter 24 in accordance with embodiments of the present techniques. The I/O adapter 24 is configured to provide system power to the I/O modules 22, as well as to enable conversion between the communications protocols of the I/O devices 22 and the control/monitoring device 14. As illustrated, the I/O adapter 24 and the plurality of I/O devices 22 are mounted to a DIN rail 26, which is an industry standard support rail for mounting control equipment in racks and cabinets. As described in greater detail below, the plurality of I/O devices 22 are electrically coupled in series along the DIN rail 26 such that field power and system information and power may be communicated between the I/O devices 22, and back through the I/O adapter 24 to the control/monitoring device 14. In other embodiments, the DIN rail 26 may be replaced with a different type of mounting structure.

As also described in greater detail below, each of the I/O devices 22 includes a base 28 for physically and communicatively connecting the I/O device 22 to the DIN rail 26, the I/O adapter 24 and/or adjacent I/O devices 22. In addition, the base 28 of the I/O device 22 is configured to physically and communicatively connect the I/O device 22 with other I/O devices 22 via the DIN rail 26, field and system electrical contacts as described in greater detail below, base connection features as described in greater detail below, and so forth. In addition, each of the I/O devices 22 includes a terminal block 30 (which, in certain embodiments, may be removable from the base 28) for electrically connecting the I/O device 22 to field devices, such as the sensors 18 and actuators 20 illustrated in FIG. 1. As described in greater detail below, in certain embodiments, each terminal block 30 may include status indicators that are directly aligned with (e.g., adjacent to or directly integrated with) terminals of the terminal block 30. Furthermore, each of the I/O devices 22 includes one or more I/O modules 32, which include I/O control circuitry and/or logic. In general, the I/O modules 32 receive input signals from the field devices, deliver output signals to the field devices, perform general and/or specific local functionality on the inputs and/or outputs, communicate the inputs and/or outputs to the control/monitoring device 14 and/or the other I/O devices 22, and so forth.

Figure 3:
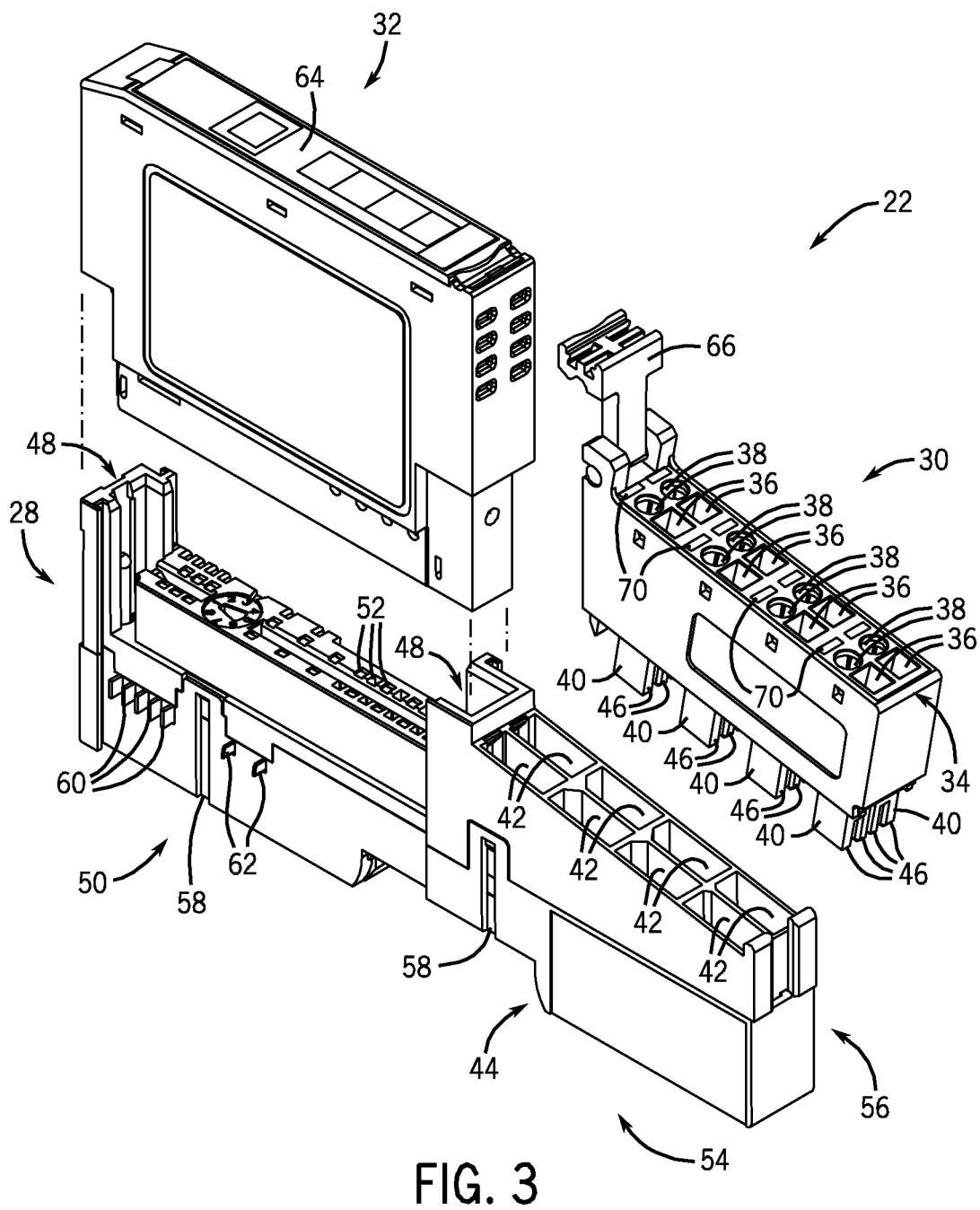
FIG. 3 is an exploded perspective view of an exemplary I/O device that includes a terminal block having terminal status indicators that are directly aligned with terminals of the terminal block in accordance with embodiments of the present techniques.

FIG. 3 is an exploded perspective view of an exemplary I/O device 22 that includes a terminal block 30 having terminal status indicators that are directly aligned with terminals of the terminal block 30 in accordance with embodiments of the present techniques. In the embodiment illustrated in FIG. 3, the terminal block 30 is a removable terminal block that may be physically connected and electrically coupled to the base 28 during assembly of the I/O device 22, and physically disconnected and electrically decoupled during disassembly (e.g., for servicing) of the I/O device 22. The removable nature of the illustrated terminal block 30 enables replacement of the I/O module 32 without the need for re-wiring. However, as described above, in other embodiments, the terminal block 30 may be directly integrated with the base 28. Such integrated embodiments may be desirable, for example, in process automation control applications for which the specific arrangement of electrical connections may be somewhat complex, and the ability to maintain these electrical connections during servicing is of greater importance.

As illustrated, the terminal block 30 includes eight terminals 34 (i.e., channels) for connecting field device wiring to the terminal block 30. Each of the terminals 34 is associated with a particular input to or output from a field device. As illustrated, each terminal 34 includes a terminal opening 36 into which a field wire electrically connected to a field device may be inserted, and an attachment activator (e.g., a terminal screw) 38, which when activated (e.g., tightened) causes a clamp or other electrical wiring connection mechanism within the terminal block 30 to tighten around an end of a field wire that has been inserted into the associated terminal opening 36. As illustrated, each of the terminals 34 terminates at the back of the terminal block 30 with a terminal block connector 40, which may be inserted into terminal block connector openings 42 in the front of a terminal block bay 44 of the base 28 to physically and communicatively connect the terminal block 30 with the base 28. In the illustrated embodiment, each of the terminal block connectors 40 include two opposing electrical prongs 46 that slide around and electrically connect with a single electrical prong (not shown) in the respective terminal block connector opening 42 of the terminal block bay 44 of the base 28. However, in other embodiments, other types of terminal block connectors 40 may be used to electrically connect with mating electrical connectors in the respective terminal block connector opening 42 of the terminal block bay 44 of the base 28.

The I/O module 32 may also be physically and communicatively connected to the base 28 by inserting the I/O module 32 into a mating slot 48 in an I/O module bay 50 of the base 28. When the I/O module 32 is inserted into the slot 48 in the I/O module bay 50 of the base 28, the I/O module 32 becomes electrically coupled to the terminals 34 of the terminal block 30 via internal circuitry within the base 28 that electrically connects the electrical prongs (or other suitable electrical connectors) in the terminal block connector openings 42 to respective electrical outlets 52 in the front of the I/O module bay 50 of the base 28. The electrical outlets 52 for each channel are in turn electrically coupled to the I/O module 32 via respective electrical connectors (not shown) that, in certain embodiments, extend from the back of the I/O module 32. As such, the terminal block 30, the base 28, and the I/O module 32 are all electrically and communicatively coupled together such that signals to and from the field device to which the I/O device 22 is connected are shared between the terminal block 30, the base 28, and the I/O module 32.

In addition, the I/O device 22 may also be electrically coupled to an I/O adapter 24 electrically upstream, and/or other I/O devices 22 electrically upstream or electrically downstream via electrical coupling features of the I/O device 22. In certain embodiments, components that are coupled electrically upstream of the I/O device 22 are components that are on a left side 54 of the I/O device 22 when viewing the I/O device 22 from the front, and components that are electrically coupled downstream of the I/O device 22 are components that are on a right side 56 of the I/O device 22 when viewing the I/O device 22 from the front. However, in other embodiments, the upstream and downstream electrical coupling features may be configured differently.

In certain embodiments, adjacent I/O devices 22 may be physically attached to each other via one or more connection features (e.g., slots) 58 of the base 28 on one of the sides (e.g., the left side 54 of the illustrated embodiment) of the I/O device 22 near the back of the base 28. Mating connection features such as protrusions (not shown) on the opposite side (e.g., the right side 56 of the illustrated embodiment) of the base 28 of the I/O device 22 near the back of the base 28. In certain embodiments, connection features of an I/O device 22 may slide into mating connection features of an adjacent I/O device 22, thereby physically attaching the adjacent I/O devices 22.

When adjacent I/O devices 22 are physically attached to each other, system electrical contacts 60 on the base 28 on one of the sides (e.g., the left side 54 of the illustrated embodiment) align with and are electrically coupled to mating electrical contacts (not shown) on the base 28 on the opposite side (e.g., the right side 56 of the illustrated embodiment) of an adjacent I/O device 22. Similarly, field electrical contacts 62 on the base 28 on one of the sides (e.g., the left side 54 of the illustrated embodiment) align with and are electrically coupled to mating electrical contacts (not shown) on the base 28 on the opposite side (e.g., the right side 56 of the illustrated embodiment) of an adjacent I/O device 22. In the illustrated embodiment, the I/O device 22 includes five system electrical contacts 60 and two field electrical contacts 62. In such an embodiment, system power may be electrically communicated via electrically connected I/O devices 22 and/or the I/O adapter 24 via two of the system electrical contacts 60, while the three other system electrical contacts 60 are used for transmission of data (e.g., relating to signals transmitted to and from the field devices to which the I/O devices 22 are electrically connected) between the electrically connected I/O devices 22 and the I/O adapter 24. In addition, the two field electrical contacts 62 are used to electrically communicate power to the field devices to which the I/O devices 22 are electrically connected. However, it will be understood that the specific number of system electrical contacts 60 and field electrical contacts 62 may vary between implementations depending on the requirements for power and data transmission of the I/O devices 22.

As illustrated, in certain embodiments, the I/O module 32 may include a status display 64 on the front face of the I/O module 32 for displaying operating status information of the I/O module 32, the base 28, and the terminal block 30. The status display 64 may, for example, include status light emitting diodes (LEDs) corresponding to each of the terminals 34 of the terminal block 30. In addition, as described in greater detail below, each of the terminals 34 of the terminal block 30 may be associated with one or more terminal status LED indicators 70 that are directly aligned with (e.g., located adjacent to or integrated directly within) their respective terminals 34. Further, in certain embodiments, once the terminal block 30 and the I/O module 32 are physically and communicatively connected to the base 28 of the I/O device 22, a latch 66 or other fastening device extending from the terminal block 30 may further attach the terminal block 30 to the I/O module 32, thereby providing additional structural support and stabilizing the electrical connections between the terminal block 30, the I/O module 32, and the base 28.

As described above, the status display 64 located on the front face of the I/O module 32, which displays operating status information for the I/O module 32, the base 28, and the terminal block 30 is often located on a front face of the I/O module 32. FIG. 4 is a front view of an exemplary I/O device 22 in accordance with embodiments of the present techniques. As illustrated, there is a plurality of status indicators 68 located on the status display 64 of the I/O module 32. However, as illustrated, there is little or no alignment between the physical termination points (i.e., the terminal openings 36 and attachment activators 38 of the terminals 34) and the status indicators 68 on the status display 64 for communicating the operating status of the physical termination points. As such, it is now recognized that, when issues arise with the I/O device 22, interpreting the status display 64 and servicing the I/O device 22 based only on the status display 64 may be somewhat cumbersome and inefficient. The inclusion of status indicators associated with terminals 34 in accordance with embodiments described herein improve the diagnostics capabilities of the I/O device 22 without impacting the footprint of the I/O device 22.

More specifically, status indicators may be provided within or adjacent to the terminals 34 of the terminal block 30 of the I/O device 22. As illustrated in FIG. 4, in addition to the status display 64, each terminal 34 is associated with a respective terminal status LED indicator 70. More specifically, each terminal status LED indicator 70 is adjacent to its respective terminal 34. In certain embodiments, the I/O status of the terminal 34 is indicated by the respective terminal status LED indicator 70. In other words, if there is an issue with the communication of input and output signals between the I/O device 22 and the field device to which the I/O device 22 is connected for any given terminal 34 (i.e., channel), the terminal status LED indicator 70 associated with that terminal 34 will indicate the issue by displaying a different color than the terminal status LED indicators 70 for which the respective terminals 34 are operating with no issues. For example, as illustrated in FIG. 4, the terminal status LED indicators 70 associated with two of the terminals 34 are currently red, whereas the terminal status LED indicators 70 associated with the other eight terminals 34 are currently green.

In certain embodiments, and as described throughout herein, red terminal status LED indicators 70 indicate that there are issues with the respective terminals 34, whereas green terminal status LED indicators 70 indicate that there are no (or minimal) issues with the respective terminals 34. However, it will be understood that differently colored terminal status LED indicators 70 may also be used. Indeed, in certain embodiments, more than two colors may be used in the terminal status LED indicators 70, with each color indicating a more severe issue indicator, for example. Additionally, light emission intensity may be employed to provide status levels. As described in greater detail below, LEDs disposed within a housing of the terminal block 30 determine which colors or intensities are activated by the terminal status LED indicators 70. It should be noted that while LEDs are utilized as example light sources in the embodiments described herein, LEDs are merely representative of one type of light source that may be utilized to illuminate the status indicators in accordance with present techniques.

In addition to the I/O statuses of the terminals 34 that may be indicated by the terminal status LED indicators 70 within or adjacent to their respective terminals 34, a system I/O status or statuses of the I/O device 22 may be displayed on the terminal block 30 as well. For example, as illustrated in FIG. 4, in certain embodiments, the terminal block 30 may include a device status LED indicator 72 on an end portion 74 of the terminal block 30. For example, the end portion 74 may be the end of the terminal block 30 that abuts the respective I/O module 32 of the I/O device 22, or the end portion 74 may be the opposite end of the terminal block 30. Indeed, in other embodiments, the device status LED indicator 72 may be located anywhere along the front face of the terminal block 30. In certain embodiments, the I/O status of all of the terminals 34 collectively is indicated by the device status LED indicator 72. As such, the device status LED indicator 72 enables a hierarchical system of diagnostics and troubleshooting, where the I/O status for the I/O device 22 as a whole may first be determined via the device status LED indicator 72, and the I/O status of the individual terminals 34 may be determined via the respective terminal status LED indicators 70 when an issue is indicated with the I/O device 22 as a whole.

For example, in certain embodiments, the device status LED indicator 72 may indicate an issue if a certain number of the terminal status LED indicators 70 indicate an issue. Specifically, for example, the device status LED indicator 72 illustrated in FIG. 4 may indicate an issue if 1, 2, 3, 4, or more of the ten terminal status LED indicators 70 indicate an issue. However, in other embodiments, the device status LED indicator 72 may indicate an issue if the terminal status LED indicators 70 associated with certain critical terminals 34 indicate an issue. Moreover, in certain embodiments, the device status LED indicator 72 may indicate an issue if one or more of the issues indicated by the terminal status LED indicators 70 are of a certain severity level. As illustrated in FIG. 4, the device status LED indicator 72 is currently green. When there is determined to be an issue with the I/O status of the terminals 34, the device status LED indicator 72 may be switched to red. However, again, it will be understood that differently colored device status LED indicators 72 may be used. Indeed, in certain embodiments, more than two colors may be used for the device status LED indicator 72, with each color indicating a more severe issue indicator, for example. Additionally, light emission intensity may be employed to provide device status levels.

As illustrated in FIG. 4, the terminal status LED indicators 70 are each disposed on an upper side of their respective terminal 34, which is the side that is nearer the respective I/O module 32 of the I/O device 22. In other words, the terminals 34 are disposed at intervals along the length of the terminal block 30, and their associated terminal status LED indicators 70 are disposed on an upper side of each corresponding terminal 34. However, in other embodiments, the terminal status LED indicators 70 may be disposed in different locations (e.g., on a lower side of the corresponding terminals 34) or on sides (e.g., on the left side 54 or on the right side 56) of the terminal block 30 and adjacent their respective terminal 34. For example, FIG. 5 is a front view of an exemplary embodiment of a terminal block 30 in accordance with embodiments of the present techniques, wherein a different arrangement of the terminal status LED indicators 70 is employed. As illustrated in FIG. 5, each terminal 34 is again associated with a respective terminal status LED indicator 70 adjacent to the terminal 34. However, in this embodiment, the terminals 34 are aligned in a stacked formation lengthwise along the length of the terminal block 30, with each respective terminal status LED indicator 70 located toward the left side 54 of the terminal block 30 from its associated terminal 34. It will be understood, however, that in certain embodiments, each respective terminal status LED indicator 70 may be located toward the right side 56 of the terminal block 30 from its associated terminal 34. In addition, although illustrated in FIG. 5 as being integrated with the terminal block 30, in certain embodiments, the terminal status LED indicators 70 may be part of the I/O module 32 that surrounds, is adjacent to, or is integrated with the terminal block 30.

As with the embodiment illustrated in FIG. 4, each terminal status LED indicator 70 in FIG. 5 is adjacent to its respective terminal 34, and the I/O status of the terminal 34 is indicated by the respective terminal status LED indicator 70. In other words, if there is an issue with the communication of input or output signals between the I/O device 22 and the field device to which the I/O device 22 is connected for any given terminal 34 (i.e., channel), the terminal status LED indicator 70 associated with that terminal 34 will indicate the issue by displaying a different color than the terminal status LED indicators 70 for which the respective terminals 34 are operating with no (or minimal) issues. For example, as illustrated in FIG. 5, the terminal status LED indicators 70 associated with the second and fourth of the nine illustrated terminals are currently red, whereas the terminal status LED indicators 70 associated with six of the other seven terminals 34 are currently green. In addition, as illustrated in FIG. 5, in certain embodiments where a particular terminal 34 is not connected to the field device, the terminal status LED indicator 70 may not be lit as either red or green. For example, the terminal status LED indicator 70 associated with the ninth terminal 34 illustrated in FIG. 5 is blank, indicating that there are no wires connecting the field device to the I/O device 22 in the ninth terminal 34. It should be noted that the terminals 34 of the I/O device 22 that do not have wires connecting to the field device during operation may, for example, be terminals 34 for grounding, terminals 34 for the input of power, and so forth. As illustrated in FIG. 5 and similar to the embodiment illustrated in FIG. 4, the terminal block 30 may also include a device status LED indicator 72 for indicating a system I/O status or statuses as described above.

As described above with respect to FIGS. 4 and 5, a single I/O status may be indicated by the terminal status LED indicators 70 for any given terminal 34. However, in other embodiments, each terminal 34 may be associated with more than one terminal status LED indicator. For example, FIG. 6 is a front view of an exemplary embodiment of a terminal block 30 in accordance with embodiments of the present techniques. In the illustrated embodiment, each terminal 34 is associated with a respective terminal I/O bit status LED indicator 76 and a respective terminal field device status LED indicator 78. More specifically, each terminal I/O bit status LED indicator 76 and terminal field device status LED indicator 78 is adjacent to its respective terminal 34. The terminal I/O bit status LED indicator 76 indicates a status of I/O bits being transmitted between the I/O device 22 and the field device to which the I/O device 22 is connected for any given terminal 34 (i.e., channel), whereas the terminal field device status LED indicator 78 indicates an operating status of the field device itself relating to the respective terminal 34 (i.e., channel). In other words, if there is an issue with the communication of input and output signals between the I/O device 22 and the field device to which the I/O device 22 is connected for any given terminal 34 (i.e., channel), the terminal I/O bit status LED indicator 76 associated with that terminal 34 will indicate the issue by displaying a different color than the terminal I/O bit status LED indicators 76 for which the respective terminals 34 are operating with no (or minimal) I/O bit communication issues. Similarly, if there is an issue with the field device relating to the respective terminal 34 (i.e., channel), the terminal field device status LED indicator 78 associated with that terminal 34 will indicate the issue by displaying a different color than the terminal field device status LED indicators 78 for which the respective terminals 34 are operating with no (or minimal) issues relating to the field device. In some embodiments, different intensities of light may be employed to provide distinction, rather than different colors of light. Furthermore, in certain embodiments, each terminal 34 may be associated with more than two status LED indicators. For example, each terminal 34 may be associated with N number of status LED indicators relating to N number of operating statuses.

As illustrated in FIG. 6, the terminal block 30 includes nine terminals 34 that are referred to as "first" through "ninth" based on their respective positions relative to a top of the terminal block 30. The terminal I/O bit status LED indicator 76 associated with the fifth of the nine illustrated terminals 34 is currently red, whereas the terminal I/O bit status LED indicators 76 for the other eight terminals 34 are currently green, and the terminal field device status LED indicator 78 associated with the seventh of the nine illustrated terminals 34 is currently red, whereas the terminal field device status LED indicators 78 for the other eight terminals 34 are currently green. As such, the red terminal I/O bit status LED indicator 76 associated with the fifth terminal 34 indicates that there are issues with the I/O bit communication relating to this terminal 34, and the red terminal field device status LED indicator 78 associated with the seventh terminal 34 indicates that there is an issue with the field device relating to this terminal 34. Again, it will be understood that differently colored and/or intensely lit terminal I/O bit status LED indicators 76 and terminal field device status LED indicators 78 may be used. Indeed, in certain embodiments, more than two colors or intensities may be used in the terminal I/O bit status LED indicators 76 and terminal field device status LED indicators 78, with each color and/or intensity indicating a more severe issue indicator, for example.

As illustrated in FIG. 6 and similar to the embodiment illustrated in FIGS. 4 and 5, the terminal block 30 may also include a device status LED indicator 72 for indicating a system I/O status or statuses as described above. Again, the device status LED indicator 72 may indicate an issue for the I/O device 22 when either a threshold number of terminals 34 are currently indicating issues via the terminal I/O bit status LED indicators 76 or the terminal field device status LED indicators 78, whether specific critical terminals 34 are currently indicating issues via their terminal I/O bit status LED indicators 76 or their terminal field device status LED indicators 78, or whether a particular issue for a given terminal 34 is particularly severe. Also, although illustrated as having only a single device status LED indicator 72 in the embodiment illustrated in FIG. 6, in certain embodiments, the terminal block 30 may include two device status LED indicators 72, one relating to the terminal I/O bit status LED indicators 76 for the terminals 34, and the other relating to the terminal field device status LED indicators 78 for the terminals 34.

Figure 7:
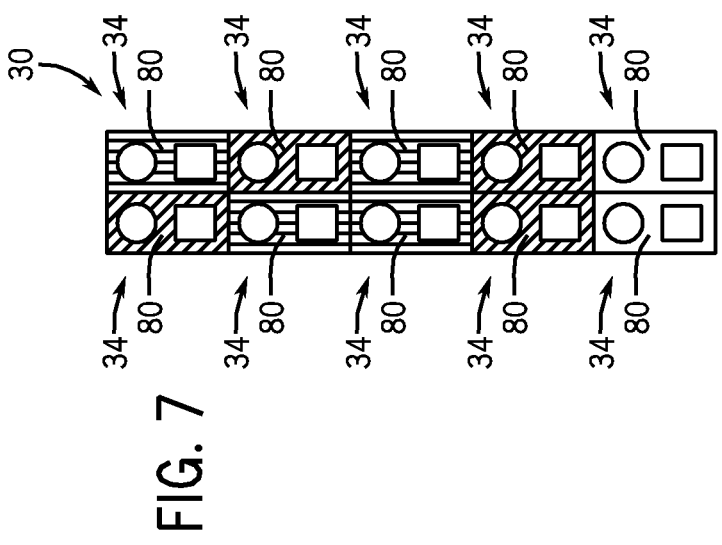
FIG. 7 is a front view of an exemplary embodiment of a terminal block having a terminal status LED indicator integrated directly within each terminal of the terminal block in accordance with embodiments of the present techniques.

Furthermore, the embodiments illustrated in FIGS. 4-6 all illustrate the terminals 34 being associated with terminal status LED indicators 70, terminal I/O bit status LED indicators 76, and/or terminal field device status LED indicators 78 that are located directly adjacent to their respective terminals. However, in other embodiments, the terminal status LED indicators 70, terminal I/O bit status LED indicators 76, and/or terminal field device status LED indicators 78 may be integrated directly within the terminals 34 themselves. For example, FIG. 7 is a front view of an exemplary embodiment of a terminal block 30 in accordance with embodiments of the present techniques. In the illustrated embodiment, each terminal 34 is associated with a respective terminal status LED indicator 70 that is integrated directly within the terminal 34. In other words, the entire front face area 80 surrounding the terminal openings 36 and/or the attachment activators 38 of the terminals 34 may constitute the terminal status LED indicators 70 associated with the terminals 34. For example, in certain embodiments, the front face area 80 surrounding the terminal openings 36 and/or attachment activators 38 of the terminals 34 may be transparent or translucent, such that the front face area 80 acts as the terminal status LED indicator 70 for the respective terminal 34. Because the terminal status LED indicators 70 are integrated directly within the entire front face area 80 of the terminals 34, the terminals 34 may be arranged either lengthwise along the terminal block 30 as illustrated in FIG. 7 and similar to the embodiment illustrated in FIG. 4, or in a stacked manner along the length of the terminal block 30 similar to the embodiments illustrated in FIGS. 5 and 6.

As with the embodiments described above, if there is an issue with the communication of input or output signals between the I/O device 22 and the field device to which the I/O device 22 is connected for any given terminal 34 (i.e., channel), the terminal status LED indicator 70, which is integrated directly into the terminal 34, will indicate the issue by displaying a different color than the terminal status LED indicators 70 for which the respective terminals 34 are operating with no (or minimal) issues. For example, as illustrated in FIG. 7, the terminal status LED indicators 70 associated with four of the terminals 34 are currently red, whereas the terminal status LED indicators 70 associated with four of the other six terminals 34 are currently green, and the terminal status LED indicators 70 associated with two of the other six terminals 34 are currently blank. As illustrated in FIG. 7 and similar to the embodiment illustrated in FIGS. 4-6, the terminal block 30 may also include a device status LED indicator 72 for indicating a system I/O status or statuses as described above.

Figure 8:
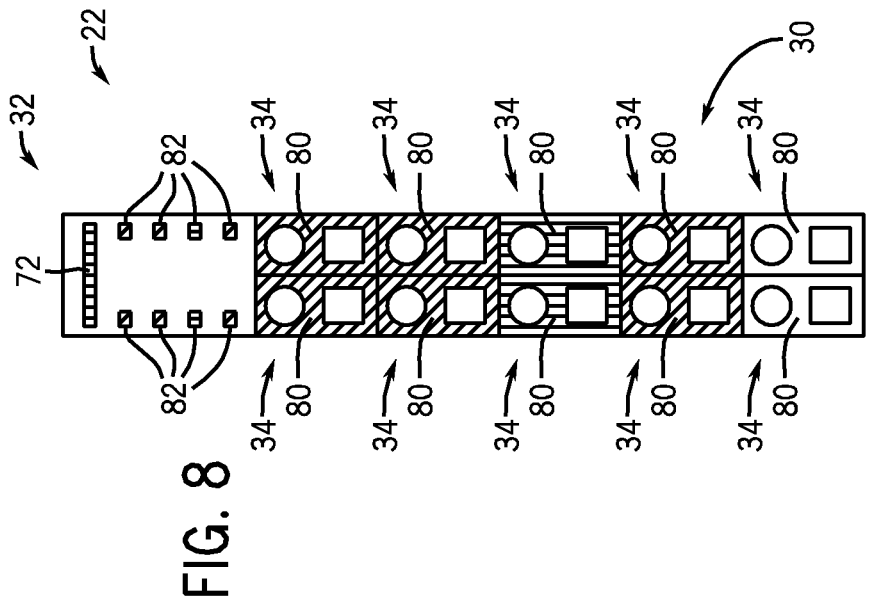
FIG. 8 is a front view of an exemplary embodiment of an I/O device having a device status LED indicator and a plurality of terminal status LED indicators located on an I/O module of the I/O device in accordance with embodiments of the present techniques.

In addition, while the embodiments illustrated in FIGS. 4-6 depict a device status LED indicator 72 on an end portion 74 of the terminal block 30, in other embodiments, device status LED indicators 72 may be located on the respective I/O module 32 of the I/O device 22. Indeed, in certain embodiments, additional terminal status LED indicators may also be located on the respective I/O module 32 of the I/O device 22. For example, FIG. 4 illustrates such an embodiment. Similarly, FIG. 8 is a front view of an exemplary embodiment of an I/O device 22 in accordance with embodiments of the present techniques, wherein terminal status LED indicators are included on the I/O module 32. As illustrated, the device status LED indicator 72 may be integrated into the I/O module 32 of the I/O device 22. Furthermore, in addition to the terminal status LED indicators 70 being integrated directly into the terminals 34 of the terminal block 30 (as illustrated in FIG. 7), the I/O module 32 may also include terminal status LED indicators 82 that are aligned on the I/O module 32 in a similar pattern as the respective terminals 34 on the terminal block 30. In certain embodiments, the terminal status LED indicators 82 on the I/O module 32 may sync with the terminal status LED indicators 70 on the terminal block 30 (e.g., to depict a general I/O status). However, in other embodiments, the terminal status LED indicators 82 on the I/O module 32 may indicate issues different than the terminal status LED indicators 70 on the terminal block 30. For example, the terminal status LED indicators 82 on the I/O module 32 may indicate whether there is an issue with the field device relating to the respective terminal 34 (i.e., channel), whereas the terminal status LED indicators 70 on the terminal block 30 may indicate whether there is an issue with the communication of input and output signals between the I/O device 22 and the field device to which the I/O device 22 is connected for the respective terminal 34 (i.e., channel), or vice versa.

It should be noted that all of the features illustrated in FIGS. 4-8 may be combined with each other in certain embodiments. For example, the terminal status LED indicators 82 on the I/O module 32 illustrated in FIG. 8 may be combined with the terminal I/O bit status LED indicators 76 and terminal field device status LED indicators 78 illustrated in FIG. 6. In such an embodiment, the terminal status LED indicators 82 on the I/O module 32 for a particular terminal 34 may indicate an issue if either or both of the terminal I/O bit status LED indicator 76 and terminal field device status LED indicator 78 associated with the terminal 34 indicate an issue, or if one of the issues indicated by the terminal I/O bit status LED indicator 76 or the terminal field device status LED indicator 78 associated with the terminal 34 is particularly severe. In other words, the embodiments illustrated in FIGS. 4-8 are not limited to only those features depicted in those figures. Rather, all of the features illustrated in FIGS. 4-8 may be combined to create more enhanced hierarchical diagnostics and troubleshooting systems.

Figure 9B:
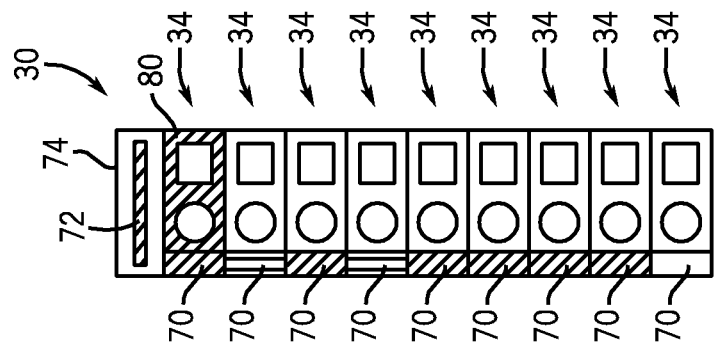
FIG. 9B is a front view of the exemplary terminal block of FIG. 9A.
Figure 9A:
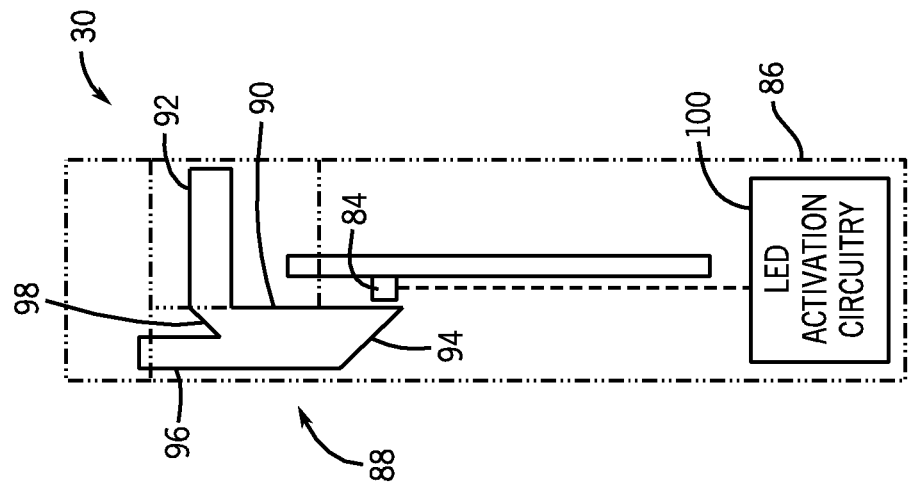
FIG. 9A is a schematic view of an exemplary terminal block having LEDs, associated light pipes, and LED activation circuitry disposed within a housing of the terminal block for illuminating the terminal status LED indicators of the terminal block in accordance with embodiments of the present techniques.

FIGS. 4-8 all illustrate terminal blocks 30 having terminal status LED indicators 70, 76, 78 that are disposed adjacent to their respective terminals 34, or which are directly integrated within their respective terminals 34 (e.g., on the front face surface 80 of the terminal block 30 corresponding to the terminal 34). In certain embodiments, all of the terminal status LED indicators 70, 76, 78 of FIGS. 4-8 may be transparent or translucent components that are capable of passing light from LEDs within the housing of the terminal block 30. FIG. 9A is a schematic view of internal components of an exemplary terminal block 30 in accordance with embodiments of the present techniques. In addition, FIG. 9B is a front view of the exemplary terminal block 30 of FIG. 9A. In certain embodiments, each of the terminals 34 may be associated with a respective LED 84 that is disposed within a housing 86 of the terminal block 30. For illustration purposes, only one LED 84 (i.e., the LED associated with the first terminal 34 illustrated in FIG. 9B) is illustrated in FIG. 9A. However, it will be understood that LEDs 84 associated with the other eight terminals 34 illustrated in FIG. 9B may also be disposed within the housing 86 of the terminal block 30.

In certain embodiments, each of the LEDs 84 associated with the terminals 34 is associated with a bifurcated light pipe 88 for directing light from the LED 84 to the terminal points to illuminate the terminal status LED indicators 70, 76, 78 that are adjacent to or integrated within the terminals 34, as well as the device status LED indicators 72, which may be located on the terminal block 30 or on the respective I/O module 32 of the I/O device 22. In other words, the bifurcated light pipe 88 may be configured to direct the light to multiple locations depending on the particular configuration of the terminal block 30. For example, as illustrated in FIG. 9A, the bifurcated light pipe 88 may include a first light pipe segment 90 that connects to a terminal indicator light pipe loop 92 for directing light to the terminal status LED indicator 70 that is adjacent to the first terminal 34 illustrated in FIG. 9B, as well as through the front face area 80 of the terminal 34, which may be transparent or translucent as described above. In addition, the bifurcated light pipe 88 illustrated in FIG. 9A includes a second light pipe segment 94 that connects to a device indicator light pipe loop 96 for directing light to the device status LED indicator 72 illustrated in FIG. 9B.

Furthermore, in certain embodiments, the device indicator light pipe loop 96 may be configured to connect with light pipes in the I/O module 32 for directing light, for example, to the terminal status LED indicators 82 on the I/O module 32 illustrated in FIG. 8. More specifically, when the terminal block 30 and the I/O module 32 of the I/O device 22 are assembled together and aligned, the device indicator light pipe loop 96 may be aligned with corresponding light pipes in the I/O module 32 such that the appropriate terminal status LED indicator 82 lights up with the appropriate color or intensity. However, in other embodiments, the I/O module 32 may include its own LEDs and light pipes for directing light to the terminal status LED indicators 82 on the I/O module 32 or to the light pipe 88 of the terminal block 30. Light pipes in the I/O module 32 may be similar to those illustrated in FIG. 9A. Furthermore, as described in greater detail below, in certain embodiments, the I/O module 32 may include the LEDs 84 and light pipes 88 disposed in a housing of the I/O module 32 for illuminating terminal status LED indicators 70 of the I/O module 32 that are adjacent to the terminals 34 of the terminal block 30.

As described above, each of the terminals 34 illustrated in FIG. 9B may be associated with at least one respective LED 84 disposed within the housing 86 of the terminal block 30. For example, in certain embodiments, each terminal 34 may be associated with two LEDs 84 for directing light to two terminal points, such as the terminal I/O bit status LED indicator 76 and the terminal field device status LED indicator 78 illustrated in FIG. 6. Furthermore, in other embodiments, each light pipe 88 may be configured to transmit light from more than one LED 84. For example, when a single terminal status LED indicator 70 or a single device status LED indicator 72 is configured to indicate a status relating to two different issues, such as an I/O bit status and a field device status, the light pipe 88 associated with the status LED indicators 70, 72 may be configured to transmit light from two different LEDs 84, each LED 84 indicating a respective issue. As described in greater detail below, internal circuitry within the terminal block 30, the base 28, or the I/O module 32 of the I/O device 22 may determine how to activate the appropriate associated LEDs 84 based on the configuration of the terminal block 30 and/or the I/O device 22 as a whole.

Regardless of the number of LEDs 84 that are associated with each terminal 34, each LED 84 is associated with a segmented, multi-component light pipe 88 for directing light from the LED 84 to its respective terminal point(s), such as the terminal status LED indicators 70, 76, 78 that are adjacent to or integrated within the terminals 34, the device status LED indicators 72 that may either be located on the terminal block 30 or on the respective I/O module 32 of the I/O device 22, and/or the terminal status LED indicators 82 located on the respective I/O module 32 of the I/O device 22. As such, each light pipe 88 is configured to transmit light from one or more inputs (i.e., the LEDs 84) to one or more outputs (e.g., the terminal status LED indicators 70, 76, 78, the device status LED indicators 72, and the terminal status LED indicators 82). For example, as illustrated in FIG. 9B, both the terminal status LED indicator 70 that is adjacent to the first terminal 34, and the front face area 80 of the first terminal 34 (which also acts as a terminal status indicator) are illuminated by light from the LED 84 illustrated in FIG. 9A through the terminal indicator light pipe loop 92.

As such, each light pipe 88 is multi-segmented, including light transmission path(s) having a plurality of discrete light pipe sections (e.g., the first and second light pipe segments 90, 94, the terminal indicator light pipe loop 92, the device indicator light pipe loop 96, and so forth). In addition, in certain embodiments, some of the light pipes 88 may include transmission enhancements that help distribute the light through the light pipe 88. For example, as illustrated in FIG. 9A, the illustrated light pipe 88 includes a transmission enhancement 98 that connects the terminal indicator light pipe loop 92 and the device indicator light pipe loop 96. The transmission enhancement 98 may include, for example, a lens or shroud for enhancing the light transmission between the terminal indicator light pipe loop 92 and the device indicator light pipe loop 96, particular geometries that are better suited for transmitting light between the terminal indicator light pipe loop 92 and the device indicator light pipe loop 96, and so forth.

It should also be noted that the embodiments described herein may apply to both removable terminal blocks 30 as well as terminal blocks 30 that are integrated with the base 28 of the I/O device 22. In other words, as described above, the LEDs 84 and the associated light pipes 88 for directing light to the terminal points (e.g., the terminal status LED indicators 70, 76, 78, the device status LED indicators 72, and the terminal status LED indicators 82) of the terminal block 30 and/or the respective I/O module 32 of the I/O device 22 may be disposed within the housing 86 of the terminal block 30. As such, the LEDs 84 and associated light pipes 88 remain integrated within the housing 86 of the terminal block 30 regardless of whether the terminal block 30 is a removable terminal block 30 or integrated with the base 28 of the I/O device 22. Furthermore, as described in greater detail below, the circuitry for activating the LEDs 84 may also be disposed within the housing 86 of the terminal block 30, enabling all of the LED indicator functionality to be modular with respect to the terminal block 30, regardless of whether the terminal block 30 is a removable terminal block 30 or integrated with the base 28 of the I/O device 22. In other embodiments, the circuitry for activating the LEDs 84 may be disposed within the base 28 or the I/O module 32 of the I/O device 22. For example, as described in greater detail below, in certain embodiments, the I/O module 32 may include the LEDs 84 and the associated light pipes 88 for directing light to the terminal points (e.g., the terminal status LED indicators 70, 76, 78, the device status LED indicators 72, and the terminal status LED indicators 82) of the respective terminal block 30 and/or the I/O module 32.

The LEDs 84 that are embedded within the housing 86 of the terminal block 30 may be controlled to enable active LED control of the terminal status LED indicators 70, 76, 78, the device status LED indicators 72, and the terminal status LED indicators 82 described herein. In other words, instead of simply passively passing through signals between the I/O module 22 and the associated field device to activate the LEDs 84 (e.g., by varying the LED brilliance proportional to an on state current of the field device, or simply illuminating the LED 84 based on the presence or absence of a signal), LED activation circuitry 100 disposed within the housing 86 of the terminal block 30 actively determines a manner in which to activate the LEDs 84 that are also disposed within the housing 86 of the terminal block 30. For example, the LED activation circuitry 100 may receive I/O signals transmitted between the I/O device 22 and the associated field device (e.g., through the wires connected to the terminals 34 and the field device), and actively determine how the LEDs 84 should be activated based on the I/O signals. For example, in certain embodiments, the LED activation circuitry 100 may include a processor that executes software stored on a local memory of the LED activation circuitry 100 to determine how to activate the LEDs 84 based on the I/O signals. However, in other embodiments, the LED activation circuitry 100 may include hardware, such as switches, configured to convert the I/O signals into appropriate activation signals that are used to activate the LEDs 84.

Furthermore, because the LEDs 84 are controlled by the LED activation circuitry 100, the information conveyed by the terminal status LED indicators 70, 76, 78, the device status LED indicators 72, and the terminal status LED indicators 82 that are illuminated by the LEDs 84 may vary depending on the specific needs of the terminal block 30, the associated I/O module 32, and/or the I/O device 22 as a whole. For example, the information conveyed by the LEDs 84 may include fault states, on/off states, and so forth. In addition, because of the active transmission of information from the LED activation circuitry 100, in certain embodiments, the LEDs 84 may be multi-color, multi-state (e.g., flashing), and so forth, to convey various levels of frequency of issues, severity of issues, and other information. Moreover, in certain embodiments, the LED activation circuitry 100 may be configured to enable activation of the LEDs 84 to indicate statuses without the field device actually being powered on. Furthermore, the transmission of information from the LED activation circuitry 100 may be via direct connection, wireless, optical, and so forth.

Figure 10:
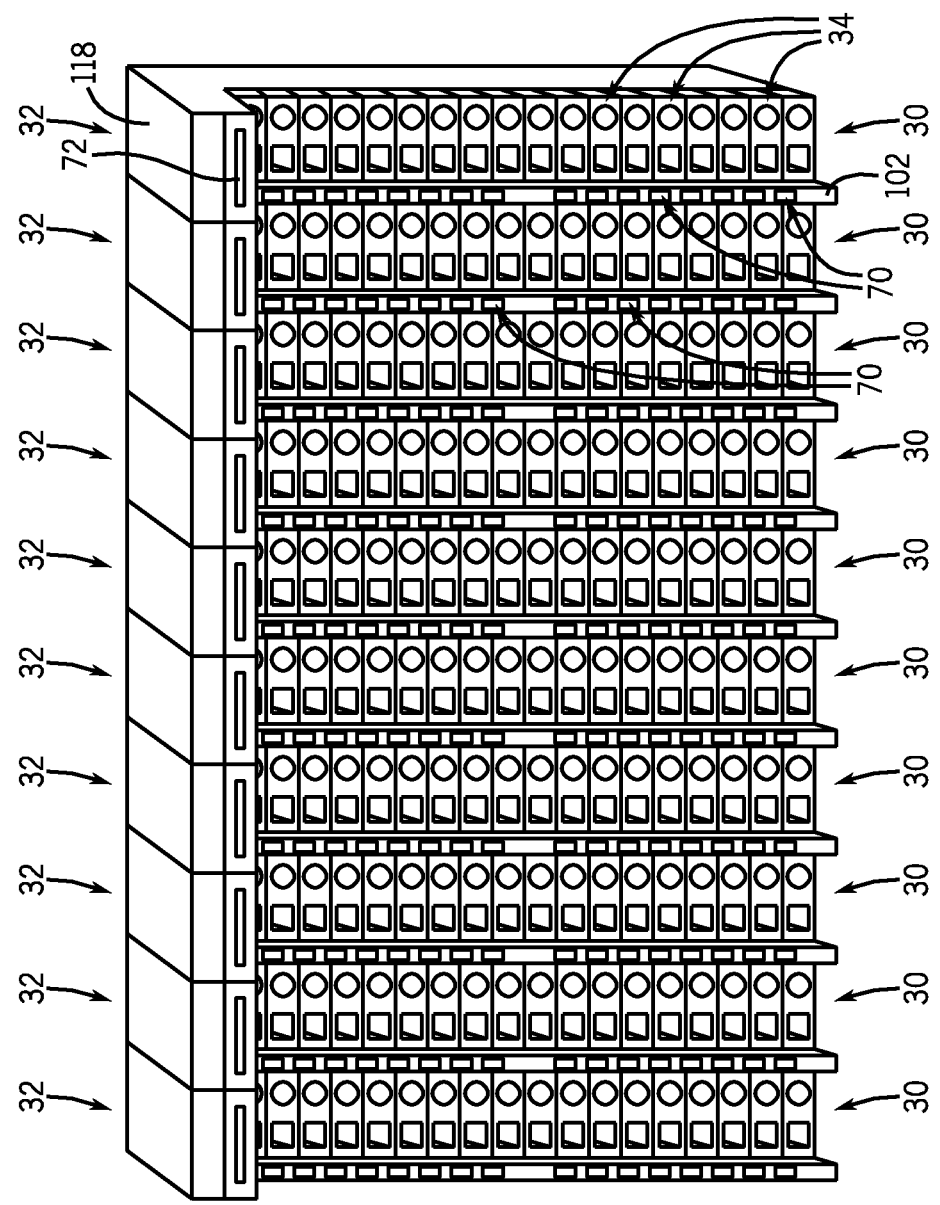
FIG. 10 is a perspective view of a plurality of exemplary I/O modules, each having a raised section with a plurality of terminal status LED indicators in accordance with embodiments of the present techniques.
Figure 11:
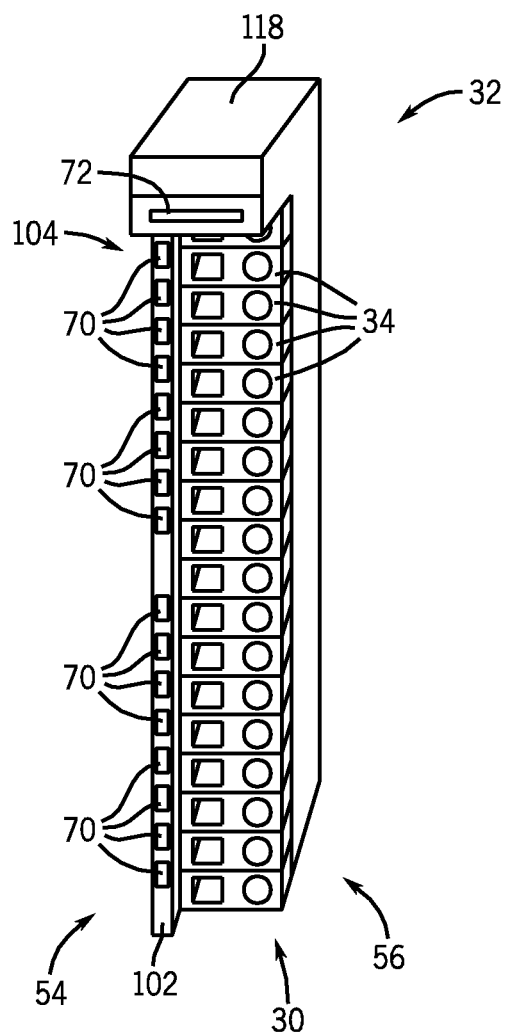
FIG. 11 is a perspective view of a single exemplary I/O module of FIG. 10 having a raised section with a plurality of terminal status LED indicators in accordance with embodiments of the present techniques.

As described above, the terminal status LED indicators 70, 76, 78 are all located proximate to (e.g., adjacent to or directly integrated within) the terminals 34 (i.e., channels) with which the terminal status LED indicators 70, 76, 78 are associated. Additionally, in certain embodiments, the I/O module 32 may include a raised section extending from a lateral side of the I/O module 32. For example, FIG. 10 is a perspective view of a plurality of exemplary I/O modules 32, each having a raised section 102 with a plurality of terminal status LED indicators 70 in accordance with embodiments of the present techniques. In addition, FIG. 11 is a perspective view of a single exemplary I/O module 32 of FIG. 10 having a raised section 102 with a plurality of terminal status LED indicators 70 in accordance with embodiments of the present techniques. As illustrated in FIGS. 10 and 11, the I/O modules 32 are adjacent to and, in certain embodiments, partially encompass their respective terminal blocks 30. Indeed, in certain embodiments, each I/O module 32 may be directly integrated with its respective terminal block 30, such that the I/O module 32 includes all of the features of the terminal block 30. As illustrated, the raised section 102 for each I/O module 32 is located on the left side 54 of the I/O module 32. However, in other embodiments, the raised section 102 may be located on the right side 56 of the I/O module 32. In both of these embodiments, the raised section 102 has generally quadrilateral sides and is located on a lateral side of the I/O module 32. Although illustrated in FIGS. 10 and 11 as being integral with the I/O module 32, in other embodiments, the raised section 102 may be integral with the adjacent terminal block 30.

As also illustrated in FIGS. 10 and 11, each of the terminal status LED indicators 70 is disposed on the raised section 102 and aligned lengthwise along the terminal block 30 with the respective terminals 34 to which the terminal status LED indicators 70 are associated. Although illustrated as having only one terminal status LED indicator 70 aligned with a respective terminal 34, in certain embodiments, each terminal 34 may have more than one terminal status LED indicator disposed on the raised section 102 and aligned with the terminal 34. For example, as with the embodiment illustrated in FIG. 6, each terminal 34 may be associated with a respective terminal I/O bit status LED indicator 76 and terminal field device status LED indicator 78 disposed on the raised section 102.

Figure 12:
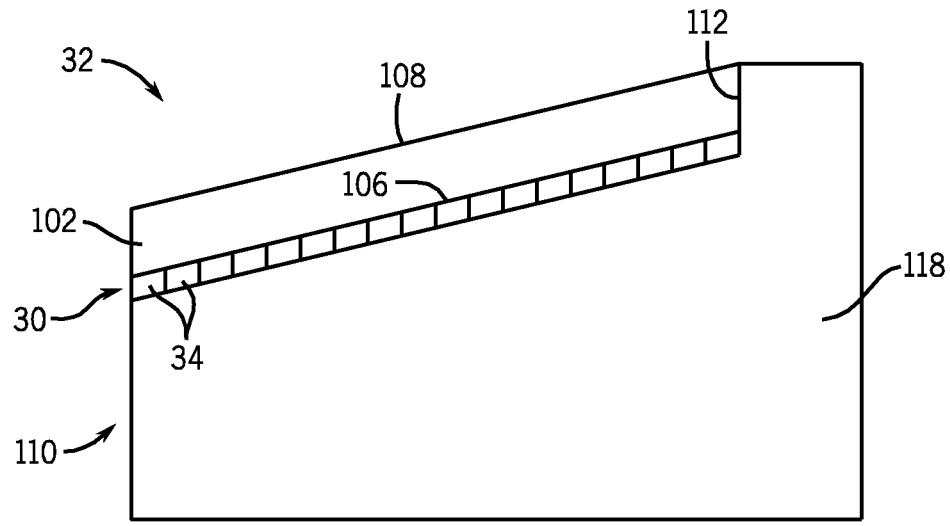
FIG. 12 is a side view of the exemplary I/O module of FIG. 11 in accordance with embodiments of the present techniques.

Having the terminal status LED indicators 70 disposed in such a non-orthogonal geometry (e.g., disposed at a vertical distance above the terminal block 30) enables the field wires that are connected to the terminals 34 to be routed between raised sections 102 of adjacent I/O modules 32 without obstructing the view of the terminal status LED indicators 70. In addition, in certain embodiments, the terminal block 30 and/or the raised section 102 may include sloped profiles to further enhance visibility of the terminal status LED indicators 70 as well as facilitate management of the field wires that are connected to the terminals 34. For example, FIG. 12 is a side view of the exemplary I/O module 32 of FIG. 11 in accordance with embodiments of the present techniques. As illustrated in FIG. 12, both a front face surface 106 of the terminal block 30 (e.g., where the terminals 34 are located) and a front face surface 108 of the raised section 102 of the I/O module 32 are sloped from an end 110 of the I/O module 32 to a raised face 112 of the I/O module 32, which extends from the front face surface 106 of the terminal block 30 to the front face surface 108 of the raised section 102 of the I/O module 32. However, in other embodiments, only the front face surface 106 of the terminal block 30 may be sloped from the end 110 of the I/O module 32 to the raised face 112 of the I/O module 32. The sloped profiles of the front face surfaces 106, 108 further enhance visibility of the terminal status LED indicators 70 because the field wires tend to build up in thickness toward the end 110 of the I/O module 32.

Returning now to FIGS. 10 and 11, in certain embodiments, the raised sections 102 may be directly integrated into the I/O module 32. However, in other embodiments, the raised sections 102 may be removable, such that they may be used with multiple I/O modules 32, or may only be inserted when a primary indication shows an error within the I/O module 32. More specifically, the raised sections 102 may be physically and communicatively connected to LEDs 84, light pipes 88, and LED activation circuitry 100 described above with respect to FIG. 9A, such that when a raised section 102 is removed from its I/O module 32, the associated LEDs 84, light pipes 88, and LED activation circuitry 100 are also removed from within a housing 118 of the I/O module 32. As such, the raised sections 102 and associated LEDs 84, light pipes 88, and LED activation circuitry 100 may constitute a removable LED indication assembly 104 that may be plugged into various I/O modules 32, with the raised sections 102 forming a body section of the removable LED indication assembly 104 having six generally quadrilateral sides.

Figure 13:
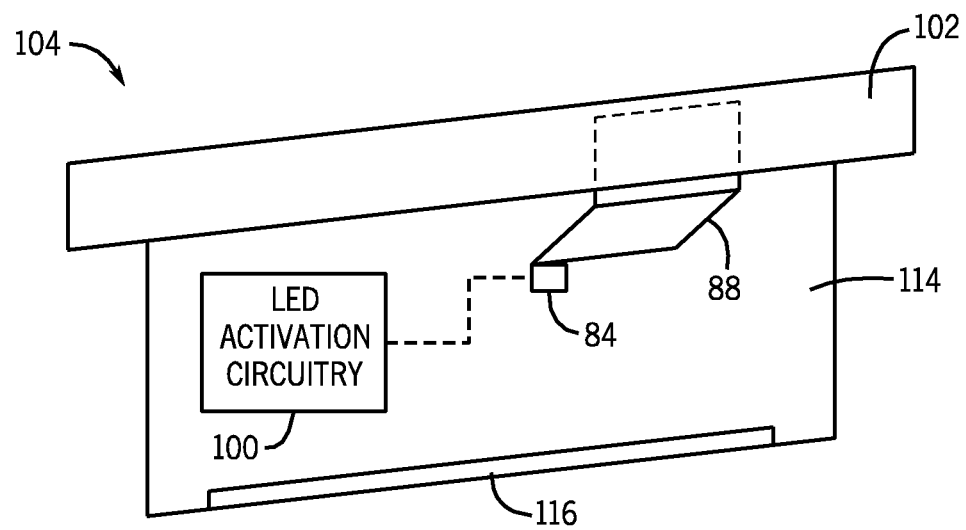
FIG. 13 is a schematic side view of an exemplary removable LED indication assembly in accordance with embodiments of the present techniques.

For example, FIG. 13 is a schematic side view of an exemplary removable LED indication assembly 104 in accordance with embodiments of the present techniques. As illustrated, in certain embodiments, the removable LED indication assembly 104 includes the LEDs 84, light pipes 88, and LED activation circuitry 100 that are illustrated in FIG. 9A. For example, in certain embodiments, the LEDs 84, light pipes 88, and LED activation circuitry 100 may all be disposed on a circuit board 114 that may be inserted into the housing 118 of the I/O module 32. However, in other embodiments, the removable LED indication assembly 104 may include only some of the components including the LEDs 84, light pipes 88, and LED activation circuitry 100. For example, in certain embodiments, the removable LED indication assembly 104 may include the LEDs 84 and the light pipes 88, while the LED activation circuitry 100 is integrated within the housing 118 of the I/O module 32, within the base 28 of the I/O device 22, or at some other location. As illustrated in FIG. 13, the removable LED indication assembly 104 also include connections 116 for physically and communicatively connecting the removable LED indication assembly 104 to the I/O module 32 (e.g., with mating connections within the housing 118 of the I/O module 32).

In certain embodiments, each of the removable LED indication assemblies 104 may be configured to indicate different levels of diagnostic information. For example, one LED indication assembly 104 may be configured to provide basic status information, such as fault states and connection statuses, whereas another LED indication assembly 104 may be configured to provide basic status information, such as fault states and connection statuses, as well as fault types and causes, measured values, and so forth. Therefore, the removable LED indication assemblies 104 enable various levels of diagnostic troubleshooting without the need to remove the terminal block 30 and/or the field wiring connected to the terminals 34 of the terminal block 30. In certain embodiments, the removable LED indication assemblies 104 may be attached directly to other circuitry within the terminal block 30 and/or the I/O module 32 when inserted into the I/O module 32. However, in other embodiments, the removable LED indication assemblies 104 may communicate with other circuitry within the terminal block 30 and/or the I/O module 32 via wireless data transmission. When wireless data transmission is used, the removable LED indication assemblies 104 may actually be located at other locations remote from their respective I/O module 32 (e.g., in a panel door). As such, the pluggable nature of the removable LED indication assemblies 104 enables a modular design for diagnostics and troubleshooting of the I/O devices 22 described herein.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An input/output (I/O) device, comprising:
a base portion configured to communicatively connect the I/O device with at least one other device;
an I/O module physically and communicatively connected to the base portion and comprising I/O communication circuitry;
a terminal block physically and communicatively connected to the base portion and having a plurality of terminals disposed on a front face of the terminal block, wherein each terminal of the plurality of terminals comprises a terminal opening configured to receive a field wire from a field device, and an attachment activator configured to cause a wiring connection mechanism to tighten around the field wire; and
a raised section extending from the terminal block lengthwise along the terminal block on a first lateral side of the terminal block, wherein each terminal of the plurality of terminals is disposed adjacent the raised section and on a second lateral side of the terminal block opposite the first lateral side of the terminal block, wherein the raised section comprises a plurality of terminal status indicators capable of displaying a status of a respective terminal, each terminal status indicator being aligned with the respective terminal, and each terminal being aligned with a respective terminal status indicator.

2. The I/O device of claim 1, wherein the front face of the terminal block includes a sloped profile having a linear slope that extends lengthwise along the terminal block.

3. The I/O device of claim 1, wherein each terminal is associated with a first terminal status indicator capable of displaying a first status of the terminal, and a second terminal status indicator capable of displaying a second status of the terminal, wherein the first and second statuses are different from each other.

4. The I/O device of claim 3, wherein the first status is indicative of a status of I/O bits being transmitted between the terminal and a field device to which the I/O device is communicatively connected, and the second status is indicative of an operating status of the field device.

5. The I/O device of claim 1, comprising a removable status indication assembly comprising the raised section, wherein the removable status indication assembly is removable from the I/O module.

6. The I/O device of claim 5, wherein the removable status indication assembly comprises a plurality of light emitters configured to emit light for illuminating the plurality of terminal status indicators, light pipes configured to receive light from one of the plurality of light emitters and to direct the light to one of the plurality of terminal status indicators, and activation circuitry for determining a manner in which to activate the plurality of light emitters to illuminate the plurality of terminal status indicators based on signals transmitted through the plurality of terminals.

7. The I/O device of claim 1, wherein the I/O module and the terminal block are integral with each other.

8. The I/O device of claim 1, wherein the raised section extends from a raised face end section disposed at a lengthwise end of the terminal block, wherein the raised face end section comprises a device status indicator capable of displaying an overall status of the I/O device, and wherein the raised section includes a sloped profile having a linear slope that extends lengthwise along the terminal block.

9. An input/output (I/O) module, comprising:
a plurality of terminals disposed on a front face of a terminal block, wherein each terminal of the plurality of terminals comprises a terminal opening configured to receive a field wire from a field device, and an attachment activator configured to cause a wiring connection mechanism to tighten around the field wire; and
a raised section extending from the terminal block lengthwise along the terminal block on a first lateral side of the terminal block, wherein each terminal of the plurality of terminals is disposed adjacent the raised section and on a second lateral side of the terminal block opposite the first lateral side of the terminal block, wherein the raised section comprises a plurality of terminal status indicators capable of displaying a status of a respective terminal, each terminal status indicator being aligned with the respective terminal, and each terminal being aligned with a respective terminal status indicator.

10. The I/O module of claim 9, wherein the front face of the terminal block includes a sloped profile having a linear slope that extends lengthwise along the terminal block.

11. The I/O module of claim 9, wherein each terminal is associated with a first terminal status indicator capable of displaying a first status of the terminal, and a second terminal status indicator capable of displaying a second status of the terminal, wherein the first and second statuses are different from each other.

12. The I/O module of claim 11, wherein the first status is indicative of a status of I/O bits being transmitted between the terminal and a field device to which the terminal block is communicatively connected, and the second status is indicative of an operating status of the field device.

13. The I/O module of claim 9, comprising:
a plurality of light emitters disposed within a housing of the I/O module, wherein the plurality of light emitters are configured to emit light for illuminating the plurality of terminal status indicators; and
a plurality of light pipes disposed within the housing, wherein each of the plurality of light pipes is configured to receive light from one of the plurality of light emitters and to direct the light to one of the plurality of terminal status indicators.

14. The I/O module of claim 13, wherein each of the plurality of light pipes is configured to receive light from two or more of the plurality of light emitters and to direct the light to two or more of the plurality of terminal status indicators.

15. The I/O module of claim 13, comprising activation circuitry for determining a manner in which to activate the plurality of light emitters to illuminate the plurality of terminal status indicators based on signals transmitted through the plurality of terminals.

16. The I/O module of claim 15, comprising a removable status indication assembly comprising the raised section, the plurality of light emitters, the plurality of light pipes, and the activation circuitry, wherein the removable status indication assembly is removable from the housing.

17. The I/O module of claim 9, wherein the raised section extends from a raised face end section disposed at a lengthwise end of the terminal block, wherein the raised face end section comprises a module status indicator capable of displaying an overall status of the I/O module, and wherein the raised section includes a sloped profile having a linear slope that extends lengthwise along the terminal block.

18. A removable status indication assembly, comprising:
a body section having a plurality of terminal status indicators disposed thereon, wherein the terminal status indicators are capable of displaying a status of a respective terminal of a terminal block, each terminal status indicator configured to align with the respective terminal when the removable status indication assembly is inserted into the terminal block or an I/O module including the terminal block, wherein each terminal is aligned with a respective terminal status indicator when the removable status indication assembly is inserted into the terminal block or the I/O module including the terminal block;
wherein the body section comprises a raised section extending lengthwise along the terminal block on a first lateral side of the terminal block, wherein each terminal is disposed adjacent the raised section and on a second lateral side of the terminal block opposite the first lateral side of the terminal block; and
wherein each terminal comprises a terminal opening configured to receive a field wire from a field device, and an attachment activator configured to cause a wiring connection mechanism to tighten around the field wire.

19. The removable status indication assembly of claim 18, comprising:
a plurality of light emitters configured to emit light for illuminating the plurality of terminal status indicators; and
a plurality of light pipes configured to receive light from one of the plurality of light emitters and to direct the light to one of the plurality of terminal status indicators.

20. The removable status indication assembly of claim 19, comprising activation circuitry for determining a manner in which to activate the plurality of light emitters to illuminate the plurality of terminal status indicators based on signals transmitted through the terminals of the terminal block.

21. The removable status indication assembly of claim 20, wherein the activation circuitry is configured to communicate with circuitry within the terminal block via wireless data transmission.

* * * * *